United States Patent
Omori

(10) Patent No.: US 9,818,634 B2
(45) Date of Patent: Nov. 14, 2017

(54) STORAGE RACK

(71) Applicant: Daifuku Co., Ltd., Osaka-shi (JP)

(72) Inventor: Kazuya Omori, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/251,379

(22) Filed: Aug. 30, 2016

(65) Prior Publication Data

US 2017/0062255 A1 Mar. 2, 2017

(30) Foreign Application Priority Data

Sep. 2, 2015 (JP) ................. 2015-173252

(51) Int. Cl.
- *H01L 21/677* (2006.01)
- *A47B 96/02* (2006.01)
- *H01L 21/673* (2006.01)

(52) U.S. Cl.
CPC ...... *H01L 21/67769* (2013.01); *A47B 96/027* (2013.01); *A47B 96/028* (2013.01); *H01L 21/67389* (2013.01); *H01L 21/67393* (2013.01); *H01L 21/67775* (2013.01)

(58) Field of Classification Search
CPC ............... A47B 96/027; A47B 96/028; H01L 21/67769; H01L 21/67775
See application file for complete search history.

(56) References Cited

U.S. PATENT DOCUMENTS

| | | | | |
|---|---|---|---|---|
| 3,031,088 A | * | 4/1962 | Ribbens ............... | A47B 57/402 211/182 |
| 4,228,906 A | * | 10/1980 | Jones .................... | A47F 5/0025 108/180 |
| 4,349,113 A | * | 9/1982 | Schreiner ............. | A47F 5/0025 211/103 |
| 5,090,579 A | * | 2/1992 | Major .................... | A47B 57/20 211/126.1 |
| 5,272,991 A | * | 12/1993 | Carrigan, Jr. ...... | A47B 87/0207 108/108 |
| 5,305,898 A | * | 4/1994 | Merl ..................... | A47F 5/0807 211/103 |
| 5,454,638 A | * | 10/1995 | Bird ....................... | A47B 57/42 108/108 |
| 5,472,103 A | * | 12/1995 | Merl .................... | A47B 47/022 211/187 |

(Continued)

FOREIGN PATENT DOCUMENTS

JP 2002252277 A 9/2002

*Primary Examiner* — Stanton L Krycinski
(74) *Attorney, Agent, or Firm* — The Webb Law Firm

(57) ABSTRACT

A storage rack including a plurality of storage sections further includes a plurality of columns with one column provided at each end along the right and left direction and a column provided at a position between two mutually adjacent storage sections, a transverse beam member extending along the right and left direction, and a support portion for supporting a stored object. Each column includes a pair of divided column members which are spaced apart from each other. The transverse beam member fixed at a location between a pair of divided column members. The support portion is supported by two mutually adjacent columns in a cantilever manner such that the support portion is in contact with the transverse beam member.

8 Claims, 8 Drawing Sheets

(56) References Cited

U.S. PATENT DOCUMENTS

| | | | | |
|---|---|---|---|---|
| 5,509,541 A * | 4/1996 | Merl | A47B 45/00 211/103 |
| 5,641,081 A * | 6/1997 | Merl | A47B 47/022 211/103 |
| 5,769,247 A * | 6/1998 | Merl | A47B 47/022 211/103 |
| 6,471,080 B1 * | 10/2002 | Hoffmann | A47B 63/00 211/126.1 |
| 7,850,022 B2 * | 12/2010 | Fulmer | A47B 57/583 211/184 |
| 8,061,539 B2 * | 11/2011 | Punzel | A47B 47/021 108/108 |
| 8,210,367 B2 * | 7/2012 | Nagel | A47F 1/125 211/126.16 |
| 8,608,264 B2 * | 12/2013 | Wing | F25D 25/02 312/408 |
| D705,586 S * | 5/2014 | Denby | D6/705.7 |
| 8,720,702 B2 * | 5/2014 | Nagel | A47B 96/027 211/193 |
| 8,942,844 B2 * | 1/2015 | Takahara | B65G 1/06 700/213 |
| 9,016,484 B2 * | 4/2015 | Kologe | A47F 1/125 211/59.3 |
| 9,064,918 B2 * | 6/2015 | Takahara | H01L 21/67769 |
| 9,064,921 B2 * | 6/2015 | Shin | H01L 21/67772 |
| 9,364,086 B2 * | 6/2016 | Takahara | A47B 81/00 |
| D767,926 S * | 10/2016 | Denby | D6/705 |
| 9,468,312 B2 * | 10/2016 | Denby | A47F 5/0043 |
| 2008/0302742 A1 * | 12/2008 | Fulmer | A47B 57/583 211/59.4 |
| 2010/0032394 A1 * | 2/2010 | Wang | A47F 5/0838 211/90.01 |
| 2012/0255924 A1 * | 10/2012 | Kologe | A47F 1/125 211/126.15 |
| 2016/0166059 A1 * | 6/2016 | Zohar | A47B 81/02 312/257.1 |

\* cited by examiner

STORAGE RACK

CROSS-REFERENCE TO RELATED APPLICATION

This application claims priority to Japanese Patent Application No. 2015-173252 filed Sep. 2, 2015, the disclosure of which is hereby incorporated in its entirety by reference.

FIELD OF THE INVENTION

The present invention relates to a storage rack including a plurality of storage sections.

BACKGROUND

Storage facilities are used to store raw materials, and intermediate products, etc., while they wait to be processed, etc., for example, in a manufacturing process of industrial products. A storage facility usually includes one or more storage racks each with a plurality of storage sections arranged in horizontal and vertical rows, such as one disclosed in JP Publication of Application No. 2002-252277 (Patent Document 1).

The storage rack of Patent Document 1 includes a plurality of columns (pillars 3), support portions (top boards 5) on each of which a stored object is placed, and supporting members (supporting ribs 6) which are fixed to the columns to support the support portions. And, in the storage rack of Patent Document 1, each support portion is fixed to supporting members by means of fastening members such that the support portion is supported from below by the supporting members each of which has one end fixed to the corresponding one of the columns located on the right hand side and the left hand side of the support portion.

SUMMARY OF THE INVENTION

However, with such an arrangement, since each member in each pair of right and left supporting members is individually fixed to the corresponding column, such arrangement suffers from a disadvantage that it is difficult to precisely position the supporting members at the same height and that the difference in the heights of the supporting members becomes the direct cause of a tilting of the support portion. And the supporting members need to be precisely positioned at the same height in order to avoid such a situation. In such a case, installation work needs to be done very carefully for all storage sections, which requires a great deal of effort during the installation work.

A storage rack is desired for which, when assembling the storage rack using a plurality of columns and a plurality of support portions, installation work can be done easily and the positioning of the support portions can be done properly.

A storage rack in accordance with the present invention is a storage rack comprising:
  a plurality of storage sections arranged along a vertical direction and a right and left direction;
  a plurality of columns each of which is provided to extend along a vertical direction and each of which includes a pair of divided column members that are spaced apart from each other in a fore and aft direction, with one column provided at each end, along the right and left direction, of the plurality of storage sections and a column provided at a position between two mutually adjacent storage sections;
  a transverse beam member which extends along the right and left direction and which is fixed to a front face of a first divided column member which is one of a pair of divided column members that is located toward a back, or to a back face of a second divided column member which is the other of the same pair of divided column members that is located toward a front; and
  a support portion for supporting a stored object, the support portion being supported at a back side thereof, in a cantilever manner, by two columns that are adjacent each other along the right and left direction such that at least a portion of the support portion is in contact with an upper end portion of the transverse beam member.

That is, the storage rack including a plurality of storage sections arranged along a vertical direction and a right and left direction comprises:
  a plurality of columns each of which is provided to extend along a vertical direction and a support portion supported by the columns for supporting a stored object, with one column provided at each end, along the right and left direction, of the plurality of storage sections and a column provided at a position between two mutually adjacent storage sections;
  wherein the support portion is supported by two mutually adjacent columns,
  wherein each column includes a pair of divided column members that are spaced apart from each other in a fore and aft direction.

The storage rack further comprises a transverse beam member which extends along the right and left direction and which is fixed to a front face of a first divided column member which is one of a pair of divided column members that is located toward the back, or to a back face of a second divided column member which is the other of the same pair of divided column members that is located toward the front, and
  wherein the support portion is fixed to the columns in a cantilever manner such that at least a portion of the support portion is in contact with an upper end portion of the transverse beam member.

With such an arrangement, since the transverse beam member whose upper end portion is in contact with the support portion can function as a positioning member, the support portion can be properly positioned in the vertical direction with a high degree of precision even when each such support portion needs to be fixed to two mutually adjacent columns. Therefore, each such support portion can be installed in its proper horizontal attitude (i.e., horizontal in a front view) and the support portions, each so arranged, in each level or horizontal row can be installed at the same height. In addition, such a highly precise positioning of the support portion can be done simply by fixing the support portion to the columns by moving it relative to the upper end portion of the transverse beam member until the support portion contacts the upper end portion; thus, the installation work can be made easier. Therefore, a storage rack can be provided for which, when assembling the storage rack using a plurality of columns and a plurality of support portions, installation work can be done easily and the positioning of the support portions can be done properly.

In addition, with the arrangement described above, since the transverse beam member for positioning is provided at a location between a pair of the divided column members along the fore and aft directions, a stored object can be inserted deeper into the storage section compared with a case in which the transverse beam member is fixed to the front face of the second divided column member. Therefore, any amount of increase in the dimension, along the fore and aft direction, of the storage rack can be reduced so that the storage efficiency of the storage rack can be improved. In addition, when the support portion is fixed to at least the first divided column member, and when a stored object is placed on the support portion, a part of the load that acts on the support portion can also be received by the transverse beam member. Therefore, the strength of the support portion to support a stored object can be increased. Furthermore, since each column includes a pair of divided column members which are spaced apart from each other along the fore and aft direction, such column has a cost saving advantage while providing the same level of structural strength as a one-piece construction.

Additional features and advantages of the present invention will be made clearer by the following description of exemplary and non-limiting embodiments described with reference to the attached drawings.

DETAILED DESCRIPTION

Embodiments of a storage facility are described next. In the present embodiment, a storage facility 1 for storing containers 7 each of which is for holding one or more semiconductor substrates which may be semiconductor wafers, etc., is described. The stored containers are an example of stored objects. The storage facility 1 of the present embodiment is installed, for example, in a clean room, and is used to store raw materials and/or intermediate products, etc., while they wait to be processed, etc., for example, in a manufacturing process of semiconductor products. The storage function of the storage facility 1 is realized by storage racks 2 each of which includes a plurality of storage sections or locations S. The storage facility 1 and the storage racks 2 of the present embodiment are described in detail next.

In the following description, each of the vertical direction V, the right and left direction H, and the fore and aft direction (or front and back direction) D is defined as seen from an observer who faces the front of the storage rack 2, in question, installed in the storage facility 1. Note that term "front" used for a storage rack 2 or any components of the storage rack 2 refers to, or is related to, a direction (along the fore and aft direction D) toward which the storage rack 2 is open to receive containers 7 so that containers 7 are inserted into the storage sections S from the front of the storage rack 2. And "back" refers to, or is related to, the direction opposite from the front along the fore and aft direction D. That is, the vertical direction V coincides with the direction along the height of the storage rack 2. The right and left direction H coincides with the lateral width direction of the storage rack 2. And the fore and aft direction D coincides with the depth direction of the storage rack 2. In addition, when a certain direction is described to be "along" a direction, in the following description, this certain direction may be but does not have to be exactly parallel to the direction; and, this concept of being "along" a direction encompasses a situation in which the certain direction is slightly tilted (for example, by an angle of 10 degrees or less) with respect to the direction. In addition, any descriptive word used to describe a direction or a dimension, etc., (such as "parallel", "equal intervals", etc.) in the following description is used to describe a concept that is considered to hold true within an error (amount of error permitted in the manufacturing or in installation).

Figure 1:
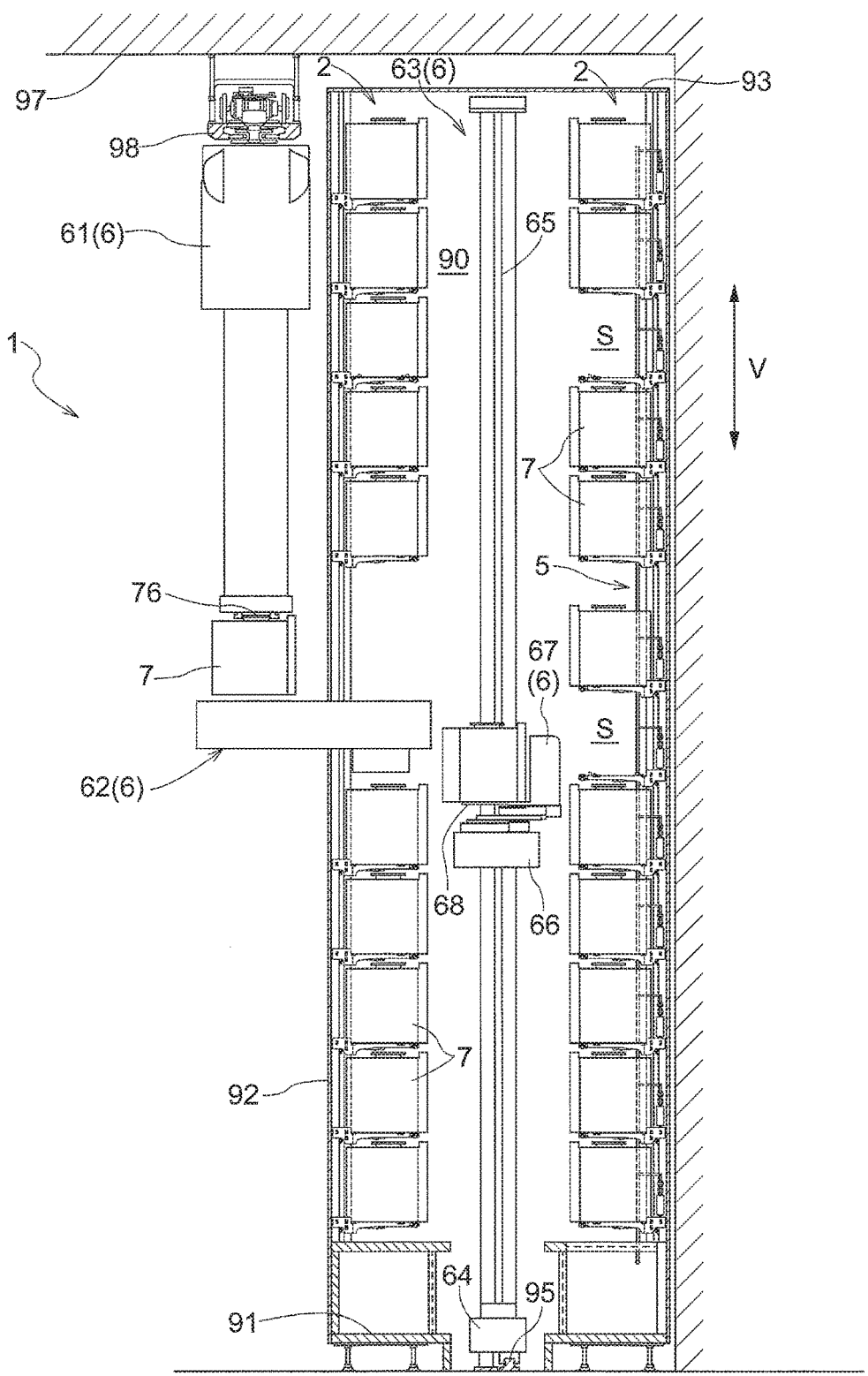
FIG. 1 is a side view of a storage facility in accordance with an embodiment.

As shown in FIG. 1, the storage facility 1 includes storage racks 2 each of which has a plurality of storage sections or locations S. In addition, the storage facility 1 further includes a gas supplying portion 5 which supplies inert gas to the containers 7 stored in the storage sections S. The storage rack 2 and the gas supplying portion 5 are installed within a storage room or space 90 which is surrounded and covered by walls including a floor portion 91, peripheral wall portions 92, and a ceiling portion 93. In addition, the storage facility 1 further includes transporting members 6 for transporting the containers 7, one at a time, to and from to the storage sections S. The transporting members 6 include one or more first transport devices 61, one or more moving devices 62, a second transport device 63, and a transfer device 67, as principal members. Each first transport device 61 is provided outside the storage room 90. Each moving device 62 is provided such that it extends through a peripheral wall portion 92. And the second transport device 63 and the transfer device 67 are provided within the storage room 90. Each action or operation of the gas supplying portion 5 and of the transporting members 6 is controlled based on a command from a controller device (not shown) provided to the storage facility 1.

The storage facility 1 includes two storage racks 2 that form a pair in the present embodiment. These two storage racks 2 are installed such that they face each other with the second transport device 63 (which is one of the transporting members 6) located between the two storage racks 2. Note that, in the present embodiment, one of the two storage racks 2 is a "purging rack" to which the gas supplying portion 5 is installed, and the other of the two is a "non-purging rack" to which the gas supplying portion 5 is not installed. These two storage racks 2 have the same basic structure, except that one has the gas supplying portion 5, and the other has an installation space for the one or more moving devices 62 which are members of the transporting members 6.

Figure 2:
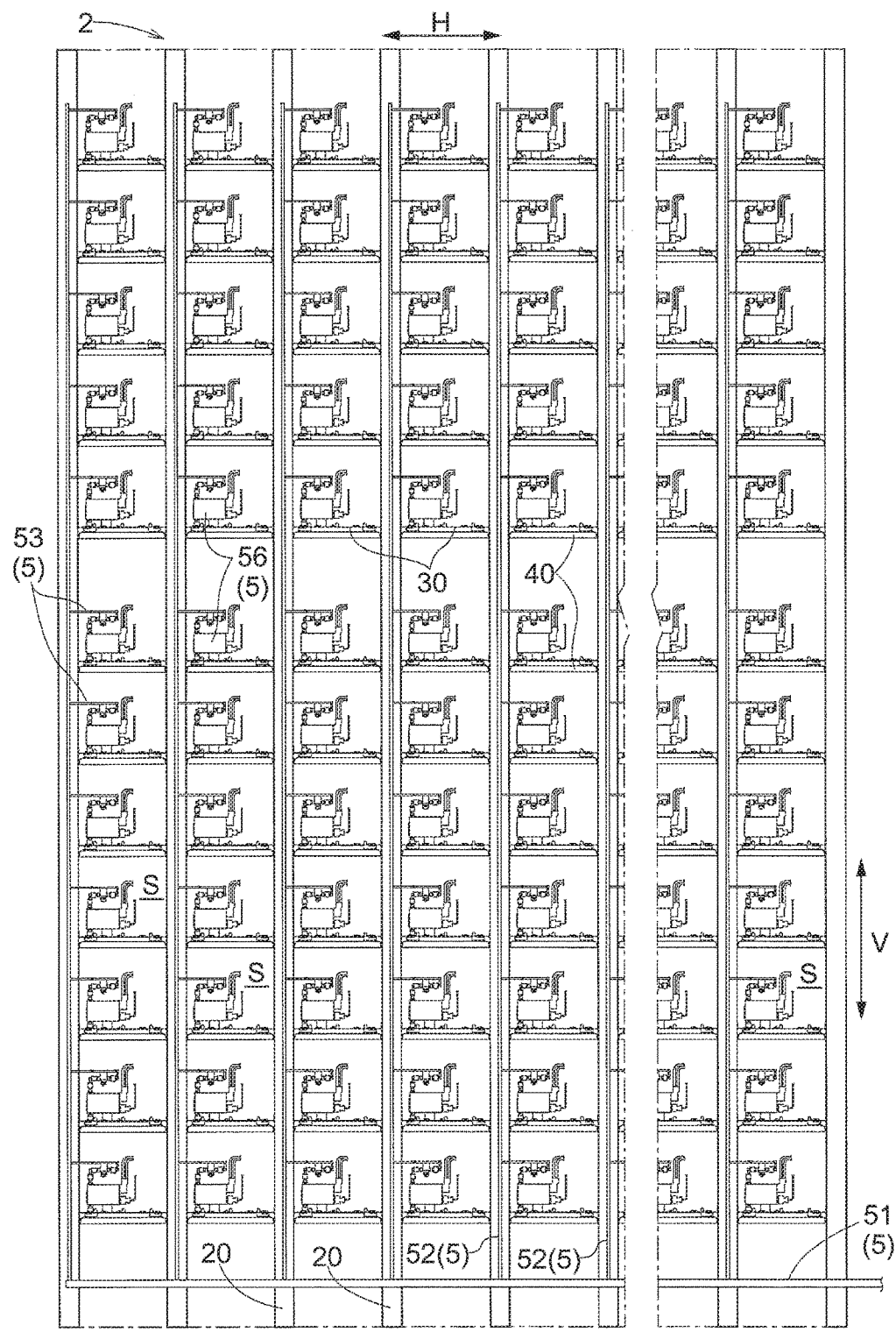
FIG. 2 is a front view of a storage rack.
Figure 3:
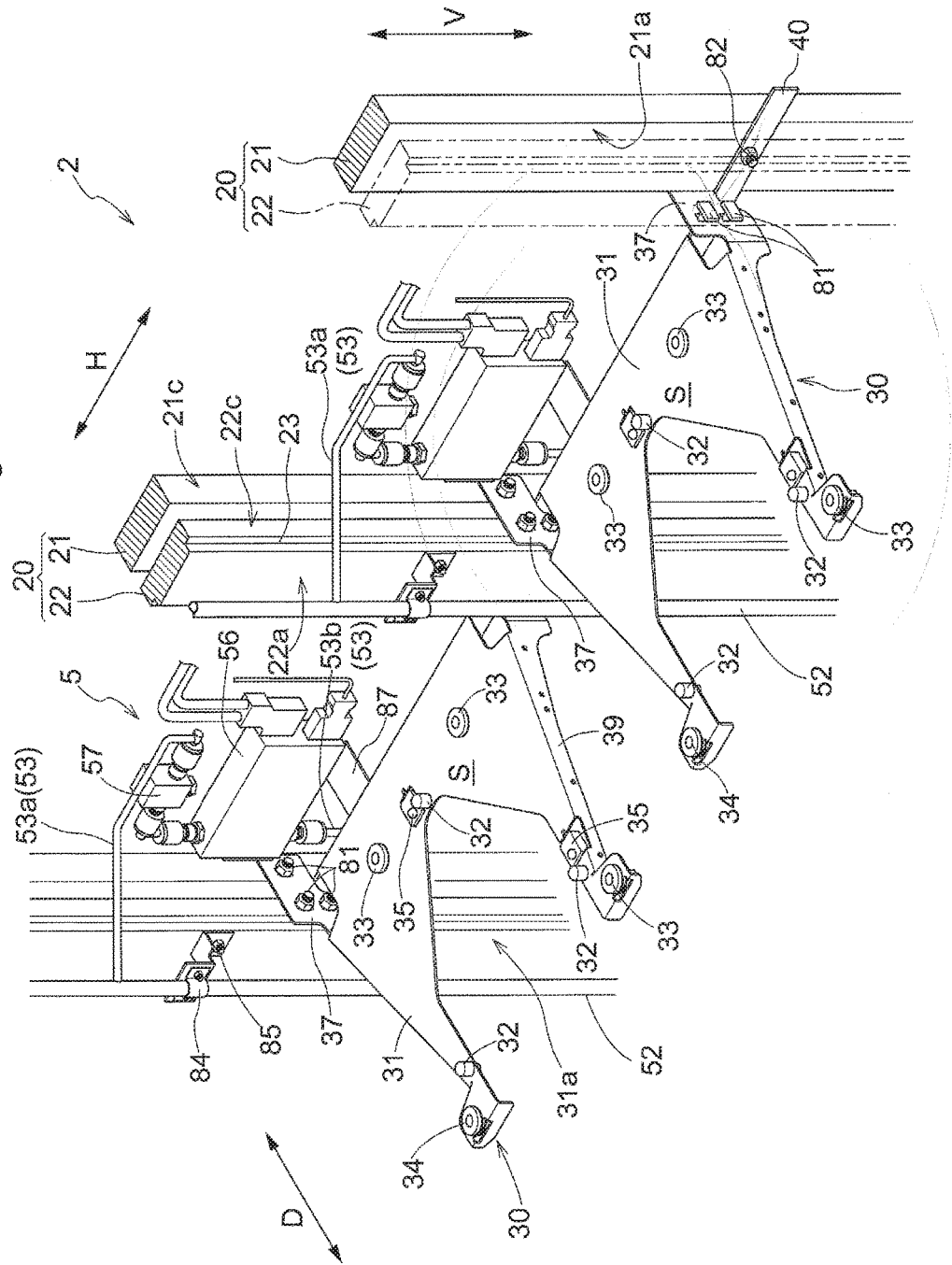
FIG. 3 is a perspective view of storage sections.

As shown in FIG. 2, each storage rack 2 includes a plurality of storage sections S which are arranged along the vertical direction and the right and left direction. The storage rack 2 has a plurality (156 in the present example) of storage sections S arranged to have m levels or horizontal rows of storage sections S one level above another along the vertical direction V (where m is any integer greater than or equal to 2 and is 12 in the present example) and to have n vertical rows of storage sections S one vertical row next to another along the right and left direction H (where n is any integer greater than or equal to 2 and is 13 in the present example). In the present embodiment, all the storage sections S belonging to any given level or horizontal row are located at the same vertical position along the vertical direction V and all the storage sections S belonging to any given vertical row are located at the same position along the right and left direction H so that the plurality of storage sections S generally form a rectangular grid as a whole.

Each storage rack 2 includes a plurality of columns 20 each arranged to extend along the vertical direction V, and the support portions 30 which are supported by the columns 20 and each of which is adapted to support a container 7. In the present embodiment, the storage rack 2 includes (n+1) columns 20 which is one more than the number of columns of the storage sections S. These (n+1) columns 20 are installed such that they are positioned along a line at equal intervals along the right and left direction H. And each support portion 30 is fixed to two mutually adjacent columns 20. In the present embodiment, at each of n locations the number of which is equal to the number of vertical rows of the storage sections S, m support portions 30, the number of which is equal to the number of levels or horizontal rows of the storage sections S, are fixed two mutually adjacent columns 20. Each storage section S is formed as a space that is formed above the corresponding support portion 30 and below the support portion 30 directly above. As such, in the present embodiment, one each of the (n+1) columns 20 is installed at one and the other ends of the storage rack 2 along the right and left direction H and at a location between any two storage sections S that are adjacent each other along the right and left direction H.

Figure 5:
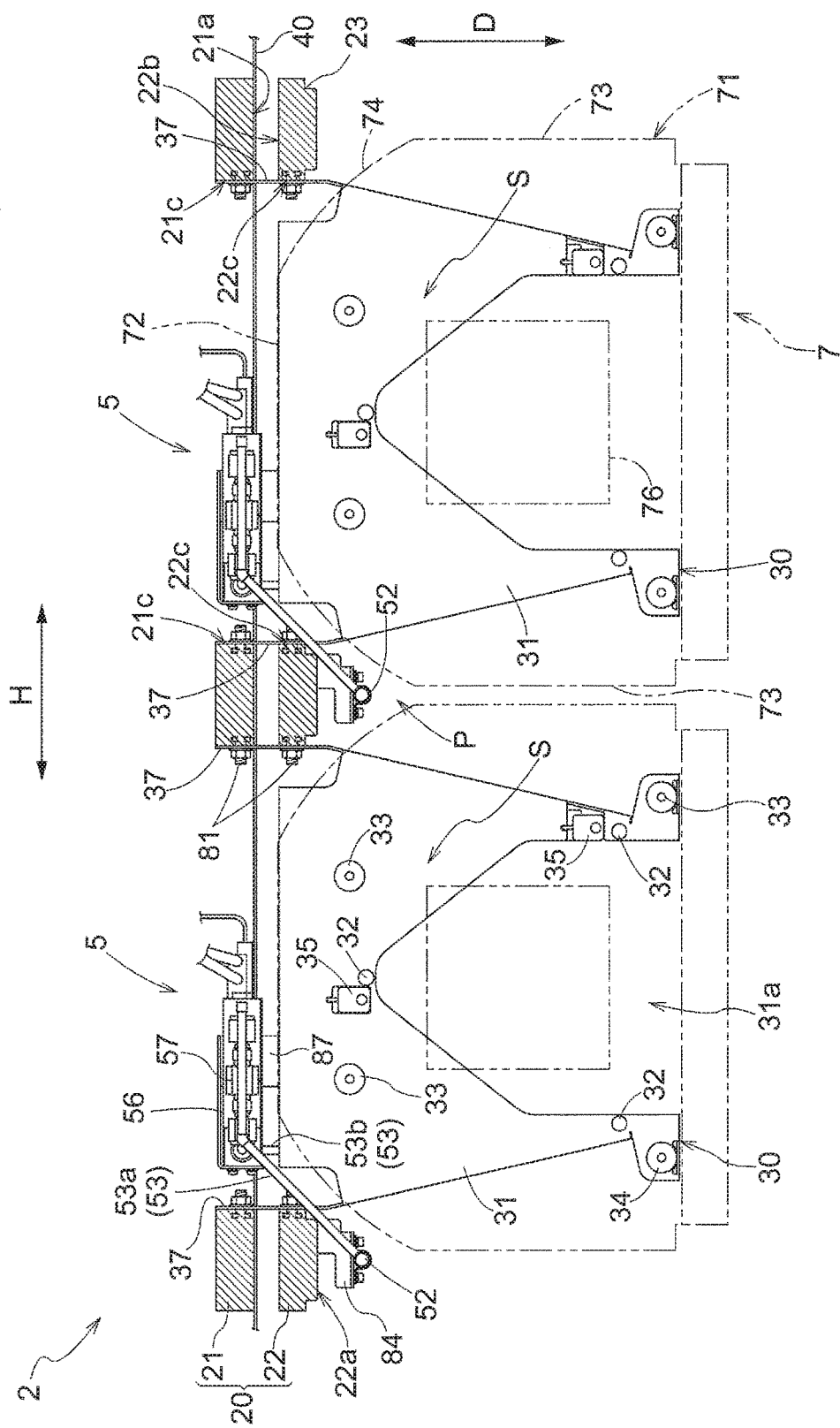
FIG. 5 is a plan view of the storage sections.
Figure 6:
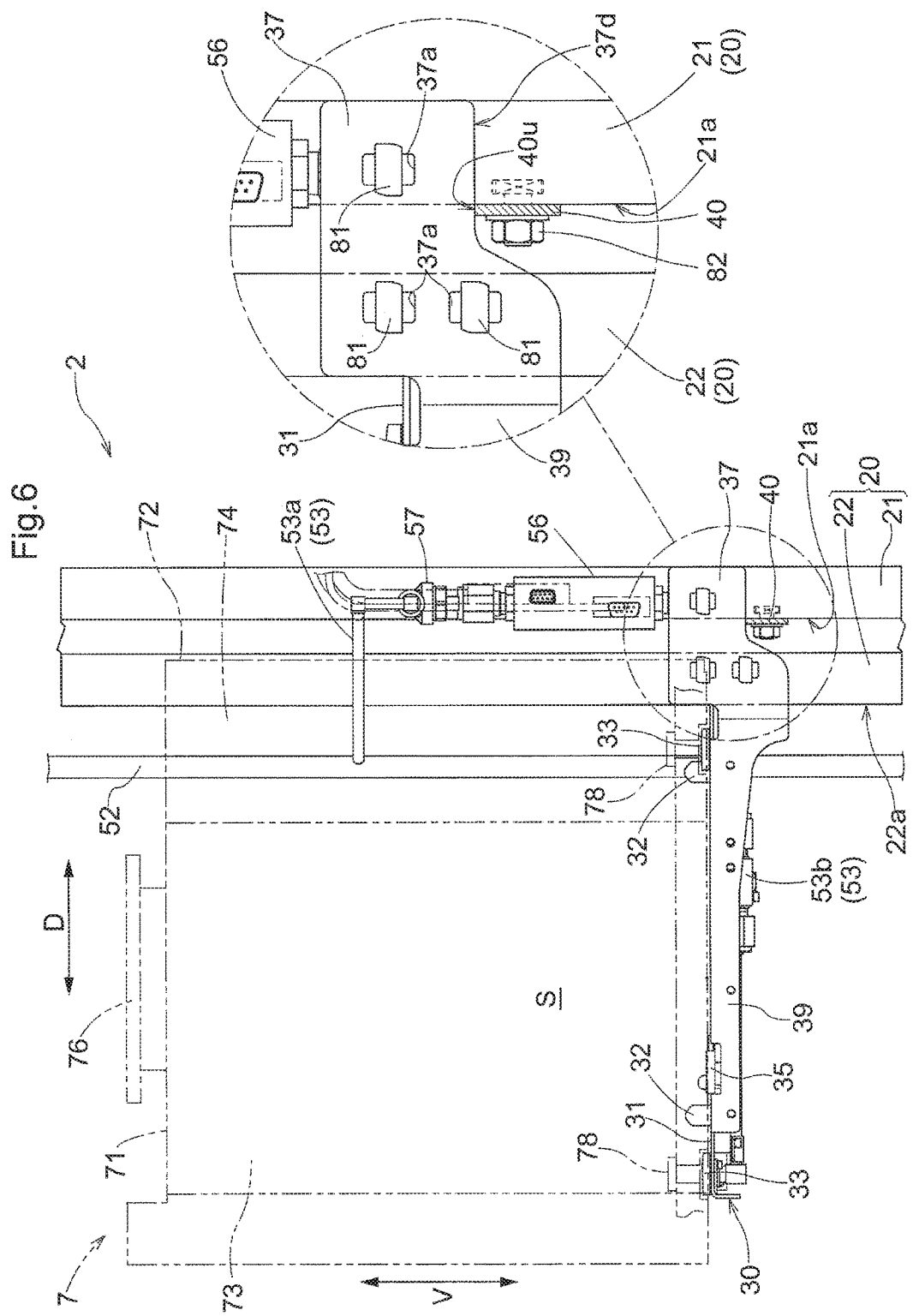
FIG. 6 is a side view of the storage sections.

In addition, a front opening container, generally formed to have a box-shape, called a FOUP (Front Opening Unified Pod), for example, may be used as a container 7. Such a container 7 may be an airtight container made of synthetic resin in compliance with the SEMI (Semiconductor Equipment and Materials Institute) specification. As shown in FIGS. 5 and 6, the container 7 includes a casing 71 having an opening, and a lid (not shown) which can be detached and attached to the casing 71 such that the opening may be covered and closed by the lid. The container 7 is so configured and constructed that its internal space is sealed in an airtight condition when the lid 71 is attached to the case 71. In addition, the container 7 further includes a flange 76 which is provided to the top surface and which can be held or gripped by a first transport device 61.

The casing 71 which is a component of the container 7 is generally formed to have a rectangular parallelepiped shape as a whole. The expression "generally formed to have a rectangular parallelepiped shape" means that the case 71 may have portions that may not precisely conform to the corresponding portions of the shape of a rectangular parallelepiped but its general shape as a whole is that of a rectangular parallelepiped. (Other expressions in the description that include terms such as "generally formed", "generally form", or "general shape" to describe a shape, etc. should be understood in a similar manner.) The container 7 has slanted wall portions 74 each of which is generally formed to have a planar or curved surface in an area between a back wall portion 72 and a corresponding side wall portion 73. As such, the container 7 of the present embodiment is generally formed to have a rectangular parallelepiped shape with some corners cut off so as to have a slanted wall portion 74 on each of the right hand side and the left hand side on the back side of the container 7. Taking into consideration the three-dimensional shape of such containers 7, each column 20 installed between any two mutually adjacent storage sections S is located in a space formed between two opposing slanted wall portions 74 of two containers 7 that are placed on respective support portions 30 and that are located adjacent each other along the right and left direction H (see FIG. 5). This arrangement allows the plurality of columns 20 which partly form the storage rack 2 to be installed such that they are properly distributed over a length along the right and left direction H while avoiding interference between the columns 20 and the containers 7 that are the stored objects.

As shown in FIGS. 3-6, each support portion 30 is fixed in a cantilever manner to the columns 20 at the back side (deeper end side), along the fore and aft direction D, of the support portion 30. The front side (proximate side, or the side closer to an observer facing the front of the rack) of each support portion 30 along the fore and aft direction D is open. Such a cantilever arrangement is advantageous in that it facilitates transfer of a container 7 into the storage section S from the front side.

Each support portion 30 includes a support main body 31 for receiving and supporting from below the container 7 placed thereon, and a pair of attachment plate portions 37 fixed to respective columns 20. The support main body 31 is generally formed to have a shape of a flat plate extending along the right and left direction H and the fore and aft direction D. The support main body 31 has a cutout portion 31a that is on the front side and that is generally formed to have a pentagon shape in plan view, so that the support main body 31 is generally formed to have a U-shape in plan view. The cutout portion 31a of the support main body 31 provides a space which a support member 68 provided to the transfer device 67 can pass through vertically.

A plurality (three, in the present example) of projecting pins 32 are provided on the top surface of the support main body 31 so that they project upward. The plurality of projecting pins 32 are provided along the cutout portion 31a. Engaging recess portions (not shown), which are formed as grooves or holes, etc., are formed in the bottom surface of the container 7. The container 7 is properly positioned on the support main body 31 when the projecting pins 32 and corresponding engaging recess portions of the container 7 engage each other. In the present embodiment, one projecting pin 32 is provided near the top vertex of the cutout portion 31a generally formed to have a pentagon shape, and two projecting pins 32 are provided near respective distal end portions of the projecting side of the generally U-shaped support main body 31 (the distal end portions of the U-shape). The distance, along the right and left direction H, between the two projecting pin 32 provided in the distal end portions of the U-shape is less than the distance between a pair of adjacent columns 20 that are adjacent each other along the right and left direction H.

In addition, provided on the top surface of the support main body 31 are gas introducing portions 33 for supplying inert gas supplied from the gas supplying portion 5 into the container 7, and a gas discharge portion 34 for allowing the gas being discharged from inside the container 7 to pass through. Each of the gas introducing portions 33A is connected to a branch pipe 53, which is a component of the gas supplying portion 5 and is described below. And the gas discharge portion 34A is connected to a discharge pipe (not shown) whose end on the opposite side is open. Formed in the bottom surface of the container 7 are intake openings 78 (see FIG. 6) for allowing the inert gas supplied from the gas supplying portion 5 to be introduced into the container 7, and an outlet opening (not shown) for allowing the gas that exists in the internal space of the container to be discharged. When the container 7 is properly positioned on the support main body 31, each gas introducing portion 33 communicates to (i.e., is connected to for allowing the passage of gas) the corresponding intake opening 78 whereas the gas discharge portion 34 communicates to the outlet opening. When inert gas of predetermined pressure is supplied from the gas supplying portion 5, the inert gas is injected into the container 7 through each intake opening 78 while the gas inside the container 7 is allowed to be discharged or released through the outlet opening to the outside.

In addition, a plurality (two in the present example) of load presence sensors 35 are also provided on the top surface of the support main body 31. Each load presence sensor 35 can be, for example, a pressure-sensitive sensor, etc. The load presence sensors 35 detect whether a container 7 is placed on the support portion 30 (i.e., whether a container 7 is stored in the storage section S or not).

Each of the pair of attachment plate portions 37 is generally formed in the shape of a flat plate extending along the vertical direction V and the fore and aft direction D. One and the other of the pair of attachment plate portions 37 are located at one and the other end portion respectively, along the right and left direction H, of the support portion 30 such that they face toward each other along the right and left direction and such that each is in surface contact with a side face of the corresponding column 20. Each attachment plate portion 37 is so disposed that each attachment plate portion 37 and the corresponding support main body 31 are placed at an angle with each other (perpendicular to each other, in the present example). Each attachment plate portion 37 is generally formed to have a shape of an L as seen in a side view. Each attachment plate portion 37 is so located that, on the back side of the support main body 31, a portion of the attachment plate portion 37 is located further to the back than the support main body 31. A plurality (three in the present example) of insert openings 37*a* each of which extends through the attachment plate portion 37 in the thickness direction (along the right and left direction H in the present example) are formed in each attachment plate portion 37 (see FIG. 6). These insert openings 37*a* are holes for inserting the shanks of bolts that form fastening members 81 for fixing the support portion 30 to the column 20.

The support portion 30 further includes a pair of rib portions 39 that are so disposed that each rib portion 39 and the support main body 31 are at an angle with each other (perpendicular to each other in the present example). Note that the expression "rib portion" refers to a reinforcing member with or without an elongated ridge. Each rib portion 39 of the pair of rib portions 39 is generally formed to have a shape of a long narrow flat plate that extends along the vertical direction V and the fore and aft direction D. Each rib portion 39 extends linearly or straight in plan view as if to connect the corresponding column 20 to the corresponding projecting pin 32 located in the distal end portion of the U-shape which is used as a location where the support main body 31 receives loads. Each is slightly tilted (about 15 degrees in the present example) with respect to the fore and aft direction D in plan view such that portions of the rib portion 39 that are located farther from the back side (where the columns 20 are located) and toward the front side (where the distal end portions of the U-shape are located) are located gradually further inward along the right and left direction (i.e., toward the center along the right and left direction).

In the present embodiment, the support main body 31 and the rib portions 39 which partially form the support portion 30 are formed integrally. In addition, the support main body 31 and the rib portions 39 which partially form the support portion 30 are formed integrally with the attachment plate portions 37. In the present embodiment, the support main body 31, the rib portions 39, and the attachment plate portions 37 are integrally formed by bending a metal plate material. In the example shown in the drawings, an example is described in which a metal flat plate with no holes is used as the metal plate material. However, the metal plate material is not limited to such an arrangement. And for example, metal plates with holes, such as a mesh plate or a punching plate may be used instead.

Since the support portion 30 has the support main body 31 and the rib portions 39 integrally formed therewith in the present embodiment, the structural strength of the support portion 30 itself can be increased. Since each rib portion 39 extends linearly or straight to connect the corresponding column 20 to the distal end portion of the U-shape which functions as a location where the support main body 31 receives a load, the support portion 30 can provide sufficient structural strength to support the container 7. In particular, the support portion 30 can provide sufficient structural strength to support the container 7 without having to separately provide any reinforcing member at the connection between the column 20 and the support portion 30. In addition, a support portion 30 having sufficient support structural strength despite its lightweight can be formed easily by bending a metal plate material.

In the present embodiment, each of the plurality of columns 20 extending along the vertical direction V includes a pair of divided column members 21, 22 which are spaced apart from each other along the fore and aft direction D (see FIG. 5). Note that the term "divided column member" does not mean that each divided column member 21 or 22 itself is divided into smaller parts and instead means that each divided column member 21 or 22 is a component of the corresponding column 20 which has a divided structure as described. The column 20 (divided column members 21, 22) having such a divided structure has a cost saving advantage while providing at least the same level of structural strength as a one-piece construction. Each of the plurality of columns 20 includes a first divided column member 21 and a second divided column member 22 spaced apart along the fore and aft direction D from, and in parallel with, this first divided column member 21. The first divided column member 21 and the second divided column member 22 are connected and fixed to each other with spacers interposed, along the fore and aft direction D, between the two with a spacer located at each of a plurality of locations along the vertical direction V. In addition, the dimension of the gap along the fore and aft directions D between the first divided column member 21 and the second divided column member 22 is sufficiently less than (for example, less than ⅕ of) the dimension, along the fore and aft direction D, of the support portion 30. Each member of the pair of divided column members 21, 22 is located at a corresponding end portion on the back side of the support portion 30. The second divided column member 22 is located to the front side of the first divided column member 21. The second divided column member 22 is so located that it overlaps with an end portion, on the back side, of the container 7 placed on the support portion 30 in a side view (see FIG. 6). On the other hand, the first divided column member 21 is located further to the back than the container 7 without overlapping with the container 7 placed on the support portion 30.

The storage rack 2 further includes transverse beam members 40 each extending along the right and left direction H. Each transverse beam member 40 extends at least between two columns 20 that are adjacent or next to each other along the right and left direction H. In the present embodiment, each transverse beam member 40 is located at a position between the pair of divided column members 21, 22 along the fore and aft direction D, because of the divided structure of the column 20. In other words, each transverse beam member 40 is provided using the gap formed, along the fore and aft direction D, between the first divided column member 21 and the second divided column member 22. More specifically, in the present embodiment, the transverse beam member 40 is fixed to the front face 21a of the first divided column member 21 which is one of the pair of divided column members 21, 22 that is located further toward the back than the other and is located further toward the back than the container 7 placed on the support portion 30. Such a fixing position makes it possible for any additional transverse beam member 40 to be added regardless of its dimension (particularly its vertical dimension) and without interfering with a container 7 placed on the support portion 30. In addition, the bolt heads of the fastening members 82 for fastening the transverse beam members 40 to the corresponding first divided column members 21 can be accommodated within the gap formed, along the fore and aft direction D, between the pair of divided column members 21, 22. As such, the transverse beam members 40 can be provided without reducing the storage efficiency or storage space, along the fore and aft direction D, of the storage rack 2.

In the present embodiment, each transverse beam member 40 is fixed to at least three mutually adjacent columns 20 that are spaced apart from one another along the right and left direction H. It is preferable that each transverse beam member 40 is fixed to several columns 20 that are mutually adjacent along the right and left direction H. For example, a transverse beam member 40 may be fixed to a half (seven in the present example) of the entire first divided column members 21 in the storage rack 2 that are mutually adjacent along the right and left direction H by using transverse beam members 40 each of which has approximately half the length, along the right and left direction H, of the storage rack 2. Thus, since the transverse beam members 40 span over a plurality of vertical rows of the storage sections S, the transverse beam members 40 can be installed with ease. In addition, this arrangement also makes it easier to install the transverse beam members 40 in their proper horizontal attitudes.

Each support portion 30 is fixed to the pairs of divided column members 21, 22 that form the corresponding columns 20 in a cantilever manner, also making use of a transverse beam member 40 described above. The support portion 30 is fixed to each pair of divided column members 21, 22 such that at least a portion of the support portion 30 is in contact with the upper end portion 40u of the transverse beam member 40. The transverse beam member 40 functions as a positioning member for setting or defining at least the setting position and installation attitude of the corresponding support portion 30 by the virtue of the fact that its upper end portion 40u comes into or is in contact with the support portion 30. This allows each support portion 30 to be accurately positioned along the vertical direction V even when each support portion 30 is fixed to each of the mutually adjacent columns 20. As a result, it becomes possible to install each support portion 30 in its proper horizontal attitude (horizontal in a front view) and to install the support portions 30 in each level or horizontal row at the same height. In addition, such a highly precise positioning of each support portion 30 can be done simply by fixing the support portion 30 to the columns 20 by moving it relative to the upper end portion 40u of the corresponding transverse beam member 40 until the support portion 30 contacts the upper end portion 40u, which makes the installation work much easier.

Furthermore, in the present embodiment, each support portion 30 is fixed to two pairs of the divided column members 21, 22 such that each of the pair of attachment plate portions 37 (i.e., each attachment plate portion 37) and the corresponding transverse beam member 40 are placed crosswise with each other and such that the lower end portion 37d of each attachment plate portion 37 is in contact with the upper end portion 40u of the transverse beam member 40 (see FIG. 6). Note that "crosswise" may or may not refer to a right angle. Such an arrangement allows the lower end portion 37d of each of the pair of attachment plate portions 37 to be in contact, in a stable manner, with the upper end portion 40u of the transverse beam member 40 with each of the pair of attachment plate portions 37 and the transverse beam member 40 placed crosswise with each other, which makes proper positioning of the support portion 30 along the vertical direction V even easier and with higher precision. The support portion 30 is fixed to each pair of divided column members by means of fastening members 81 inserted through the insert openings 37a of the corresponding attachment plate portion 37, with the attachment plate portion 37 in surface contact with each side face 21c, 22c of the pair of divided column members 21, 22 (see FIG. 5). In the present example, the support portion 30 is fixed to each second divided column member 22 at two locations of different heights and to each first divided column member 21 at one location at the same position along the vertical direction V as the upper one of the two location at which the support portion 30 is fixed to each second divided column member 22.

When fixing the support portion 30 to a column 20 using the fastening members 81 each including a bolt and a nut with the corresponding attachment plate portion 37 in surface contact with each side face 21c, 22c, the support portion 30 may tend to turn with the turning of the fastening member 81 during the fastening process. Even in such event, the turning of the support portion 30 that otherwise would have accompanied such process can be restricted or prevented by the lower end portion 37d of the attachment plate portion 37 coming into contact with the upper end portion 40u of the transverse beam member 40. The transverse beam member 40 functions also as a turning restricting member when fastening by means of the fastening members 81, by the virtue of the fact that the upper end portion 40u comes into contact with the support portion 30 (lower end portion 37d of the attachment plate portion 37). This arrangement allows each support portion 30 to be installed in its proper horizontal attitude (horizontal also in side view).

In the present embodiment, the support portion 30 is fixed to each of the two (right and left) pairs of divided column members 21, 22, such that it is fixed to each first divided column member 21 and each second divided column member 22, in other words, on both sides of the transverse beam member 40, with the transverse beam member 40 located therebetween, along the fore and aft direction D. With such an arrangement, when a container 7 is placed on the support portion 30, a part of weight or downward force acting on the support portion 30 with a fulcrum located at a fixed position in each first divided column member 21 is supported from below also by the transverse beam member 40. The transverse beam member 40 functions also as a support assist member when a container 7 is stored, by the virtue of the fact that its upper end portion 40u is in contact with the support portion 30 (lower end portion 37d of the attachment plate portion 37). Therefore, the structural strength of the support portion 30 to support a container 7 can be further increased because of synergetic effects of providing the rib portions 39 described above to the support portion 30.

The gas supplying portion 5 is installed only in the purging rack of the pair of the storage racks 2. The gas supplying portion 5 supplies inert gas to each of the containers 7 stored in storage sections S of the storage rack 2 (i.e., of the purging rack in the present embodiment). Inert gas is gas with low reactivity to objects (semiconductor substrates in the present example) held in the container 7 (i.e., gas that would not substantially cause any problematic chemical reaction). For example, nitrogen gas or noble gas, such as, gaseous argon or krypton gas, etc., may be used as inert gas.

As shown in FIG. 2, the gas supplying portion 5 includes a primary pipe 51 connected to an inactive gas supply source (not shown) such as a gas tank etc., a plurality of vertical lines 52 which branch out from this primary pipe 51, and a plurality of branch pipes 53 which branch out from each vertical pipe 52. Inert gas flows from inactive gas supply source to the primary pipe 51 then to each vertical pipe 52 and finally to each branch pipe 53 in that order before being supplied to the container 7 stored in each storage section S. The primary pipe 51 is installed to extend along the right and left direction, for example, at a height below the storage sections S in the lowest level or horizontal row. The primary pipe 51 is formed to have a sufficient diameter to supply inert gas of predetermined pressure to each and every container 7 when every one of the storage sections S has a container 7 stored in it. A manual opening and closing valve which can be manually opened and closed by a worker and an automatic control valve which can be opened and closed based on a command from a controller device are provided in an upstream portion of the primary pipe 51.

Each of the plurality of vertical pipes 52 is installed to extend along the vertical direction V. Each of the plurality of vertical pipes 52 is installed to extend upward from the primary pipe 51. Each of the plurality of vertical pipes 52 is installed extend over the entire length, along the vertical direction V, of the storage rack 2. In the present embodiment, n vertical pipes 52 which is equal to the number of vertical rows of the storage sections S are installed along a line and at equal intervals along the right and left direction H. As described earlier, the (n+1) columns 20 which form the storage rack 2 are also installed along a line at equal intervals along the right and left direction H. In present embodiment, the interval at which each vertical pipe 52 is installed (i.e., distance between any two adjacent vertical pipes 52) along the right and left direction H is set to be equal to the interval at which each column 20 is installed (the distance between any two adjacent columns 20) along the right and left direction H.

Furthermore, each of the plurality of vertical pipes 52 is fixed to the column 20 to which the support portions 30, which the inert gas should be supplied to by the vertical pipe 52, are fixed. And each of the plurality of vertical pipes 52 is installed to correspond to one of the plurality of the columns 20 to have a one to one correspondence between the vertical pipes 50 and the columns 20. In other words, one vertical pipe 52 is individually provided to each column 20 (except for one of the two at right and left ends). Put another way, one vertical pipe 52 is provided for each vertical row of the storage sections S. Each of the plurality of vertical pipes 52 is individually fixed to the corresponding column 20. As shown in FIGS. 3-6, each vertical pipe 52 is fixed to the corresponding column 20 by means of a fastening member 85 including a bolt and a nut with the vertical pipe 52 held by a first bracket 84. In the present embodiment, each vertical pipe 52 is fixed, through the first bracket 84, to the front face 22a of the corresponding second divided column member 22, which is the one located on the front side between the pair of divided column members 21, 22, which form the corresponding column 20.

Figure 4:
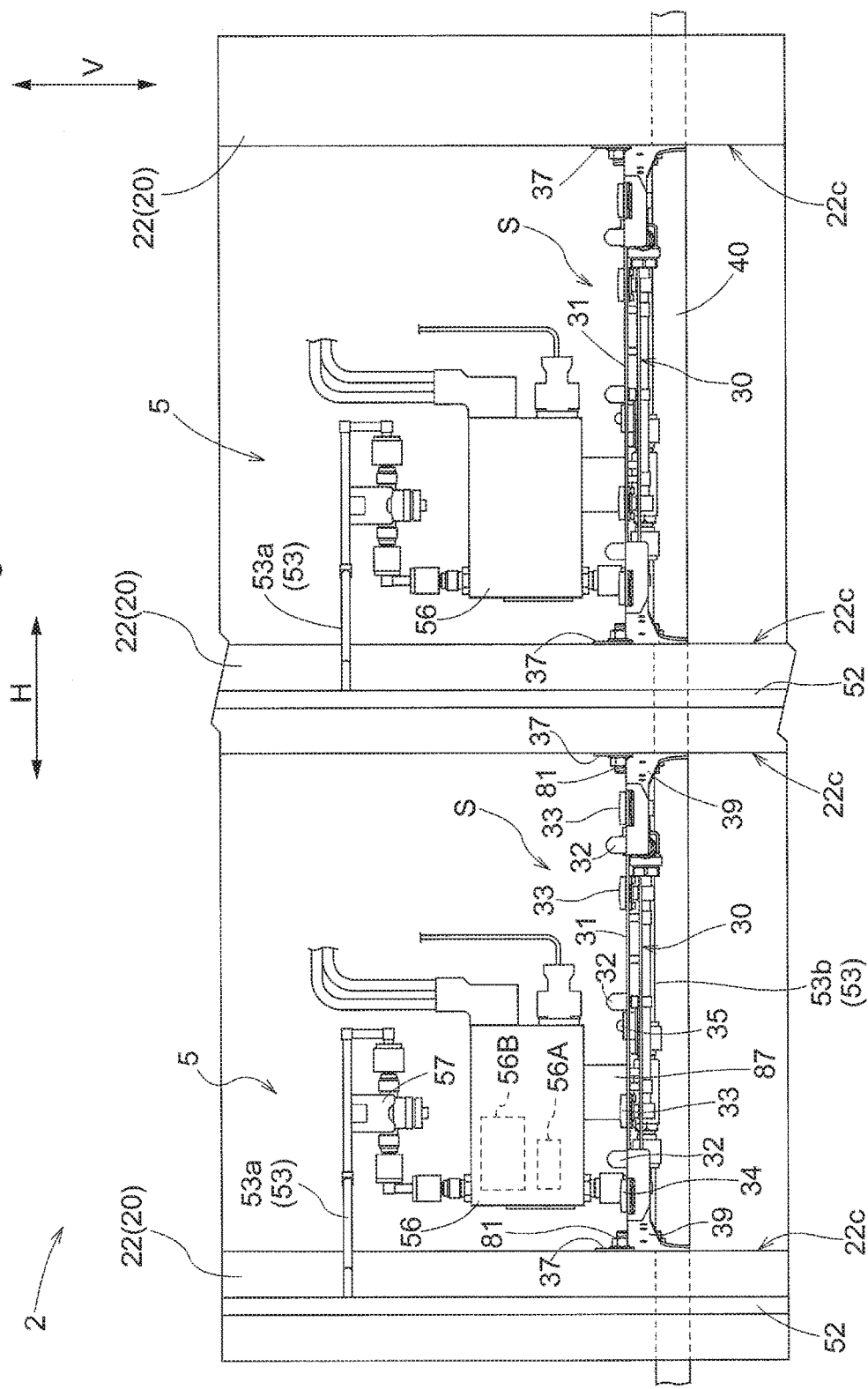
FIG. 4 is a front view of the storage sections.

As such, each of the plurality of vertical pipes 52 is located on the front side of the corresponding column 20 (the second divided column member 22) such that it overlaps with the corresponding column 20 (the second divided column member 22) in a front view (see FIG. 4). With such an arrangement, when installing a new gas supplying portion 5 to a storage rack 2 which does not have any gas supplying portion 5 installed, a worker facing the storage rack 2 can readily install and fix the vertical pipes 52 to the front faces 22a of the second divided column members 22. Installation of the vertical pipes is also facilitated because no other components of the storage rack 2 exist on the front face 22a of the second divided column member 22.

In addition, each vertical pipe 52 is located within a space P which is generally formed in a shape of a pillar and which is formed between the slanted wall portions 74 of mutually adjacent containers 7 that face each other with these containers 7 placed on two adjacent support portions 30 and the column 20 to which these support portions 30 on which these mutually adjacent containers 7 are placed are fixed (see FIG. 5). By locating each vertical pipe 52 using such a space P generally formed in a shape of a pillar, each vertical pipe 52 can be properly fixed to the corresponding column 20 (the second divided column member 22) while avoiding any interference with the containers 7 being stored in the storage sections S.

Thus, in the present embodiment, each vertical pipe 52 is made to have a smaller diameter by distributing the locations of the plurality of vertical pipes 52 which form the gas supplying portion 5 to correspond to the locations of the plurality of columns 20. For example, each vertical pipe 52 is formed to have a small diameter such that it can still supply inert gas of predetermined pressure to each of the containers 7 when each and every one of the storage sections S (the number of which is equal to the number of levels or horizontal rows) in the corresponding vertical row has a container 7 stored in it. Therefore, even when the containers 7 are stored in the storage sections S, each vertical pipe 52 is accommodated within the space P generally formed to have a shape of a column without interfering with the stored containers 7. Therefore, in contrast to the storage rack having conventional specification, it is not necessary to secure space for installing the vertical pipes 52 by sacrificing a space for installing the support portions 30; thus, all vertical columns can be used as storage sections S. Therefore, the storage efficiency of the storage rack 2 can be improved.

In addition, at least one of a manual opening and closing valve which can be manually opened and closed by a worker and an automatic control valve which can be opened and closed based on a command from a controller device may be provided in the most upstream portion of each vertical pipe 52.

Each of a plurality of branch pipes 53 branches off from the corresponding vertical pipe 52 and is connected to the gas introducing portions 33 individually provided to each support portion 30. In the present embodiment, m branch pipes 53, the number of which is equal to the number of levels or horizontal rows of the storage sections S, are connected to each vertical pipe 52. Each of the m branch pipes 53 is connected to the corresponding one of the support portion 30 that forms the storage section S in each level or horizontal row, so that there is a one to one correspondence between the branch pipes 53 and the support portions 30. In addition, in the present embodiment, all branch pipes 53 are arranged to extend in the same direction from the corresponding vertical pipe 52.

As shown in FIGS. 3-6, a flow regulator 56 is provided in each branch pipe 53. Each flow regulator 56 includes a flow rate sensor 56A which measures the flow rate of the inert gas which flows through its internal flow path, a flow rate adjusting valve or a flow control valve 56B which varies and adjusts the flow rate of the inert gas, and an internal control unit (not shown) which controls the operation of the flow rate adjusting valve 56B. The internal control unit controls the operation of the flow rate adjusting valve 56B to adjust the flow rate of the inert gas per unit time (i.e., supply flow rate to the container 7) to a target flow rate, based on the information on the detected result from the flow rate sensor 56A. As such, each flow regulator 56 has a function of adjusting the supply flow rate of the inert gas supplied to a container 7.

For example, the flow regulator 56 adjusts the supply flow rate of inert gas to a first target flow rate from the time the storing or transporting process of a container 7 into the storage section is completed and until a set initial supply period elapses, and to a second target flow rate which is set to be less than the first target flow rate, after the elapse of the set initial supply period. The flow regulator 56 may adjust the supply flow rate of inert gas in feed patterns different from the above pattern. Since such a flow regulator 56 is individually provided to each of the plurality of storage sections S, inert gas can be supplied in a desired feed pattern to each of the containers 7 stored in the storage sections S. Thus, even if the containers 7 are brought into the storage rack 2 at different times, it is easy to properly maintain the state of the contents of each container 7.

In the present embodiment, the flow regulators 56 used are the ones for which, for each flow regulators 56, the amount of gas leak is less than 0.01% when no electric power is supplied to the flow regulators 56. With such flow regulators 56 of high sealing capability, even if the system including the storage facility 1 has an emergency shut down caused by an unexpected error etc., there would be no substantial leak of inert gas from the flow regulators 56. Thus, it is not necessary to use a normally closed reserve opening and closing valve with each flow regulator 56 in preparation for such an unexpected situation. And such reserve opening and closing valves are, in fact, not used with or in addition to the flow regulators 56 of the present embodiment. As such, in the present embodiment, flow regulators 56 for which the amount of gas leak is less than 0.01% per each flow regulator 56 when no electric power is supplied are used, without providing normally closed reserve opening and closing valves. Therefore, the layout near and around each flow regulator 56 can be simplified.

Note that the storage facility of conventional specification (see FIG. 4 of JP Publication of Application No. 2015-12039) uses an air valve in which temperature changes do not occur easily, as a reserve opening and closing valve to minimize the effect on the supply flow rate of the inert gas. However, air valves used for that purpose tend to have a large size and thus have disadvantages such as the layout near and around the flow regulator 56 becoming complicated. The valve-less arrangement of the present embodiment is advantageous compared with a conventional technology of using air valves in that the layout near and around the flow regulator 56 can be simplified substantially in the present arrangement.

Note that the manual opening and closing valve which can be manually opened and closed by a worker is not a "normally closed reserve opening and closing valve" mentioned above. The manual opening and closing valve 57 is configured to be switched manually by a worker to a valve open state in which inert gas is allowed to pass through the valve and to a valve closed state which inert gas is not allowed to pass through the valve. In addition to the fact that manual opening and closing valves 57 are used in the conventional storage facilities in addition to the air valves, they are substantially smaller in size than the air valves so that there is no substantial disadvantage in using them with the flow regulators 56. Thus, a manual opening and closing valve 57 is, in fact, provided in each branch pipe 53 of the present embodiment, with the flow regulator 56.

The flow regulator 56 and the manual opening and closing valve 57 are provided such that the manual opening and closing valve 57 is located upstream of the flow regulator 56. And an upstream pipe portion 53a of the branch pipe 53 is connected to the manual opening and closing valve 57. The manual opening and closing valve 57 is connected to the introducing side port of the flow regulator 56. A downstream pipe portion 53b of the branch pipe 53 is connected to the discharging side port of the flow regulator 56. The downstream pipe portion 53b is connected to the gas introducing portions 33. When a plurality (three in the present example) of gas introducing portions 33 are provided as in the present embodiment, the downstream pipe portion 53b is split into branches depending on the number of the gas introducing portions 33 with each branch connected to the corresponding gas introducing portion 33.

In the present embodiment, each support main body 31 is formed and located such that it spans the entire distance between one and the other of the two corresponding columns 20 located to the right side and left side, respectively, of the support main body 31. That is, the area of location, along the right and left direction H, of each support main body 31 of the present embodiment is the entire region between one and the other of the two corresponding columns 20 located to the right side and left side, respectively, of the support main body 31. Each flow regulator 56 and the corresponding manual opening and closing valve 57 are located in the area of location, along the right and left direction H, of the support main body 31 of the corresponding support portion 30 is located, or exists. Each flow regulator 56 and the corresponding manual opening and closing valve 57 are located in approximately the same extent of area along the right and left direction H such that the flow regulator 56 is located at a higher position than the support portion 30, and such that the manual opening and closing valve 57 is located at a higher position than the flow regulator 56 (see FIG. 4). The upstream pipe portion 53a of the branch pipe 53 is located at a higher position than the manual opening and closing valve 57 such that it extends from the vertical pipe 52 through a container-column gap (a gap formed between the column 20 and the slanted wall portion 74 of the container 7) in the space generally formed in a shape of a pillar, and at an angle toward the back (see FIG. 5). In addition, in order to facilitate installation of the portion of the upstream pipe portion 53a that extends at an angle, cutout recessed portions 23, each of which is formed by cutting out the corresponding corner, are formed in the right and left edge portions of the front face 22a of each second divided column member 22. The upstream pipe portion 53a passes through a position that overlaps with the manual opening and closing valve 57 in plan view and is connected to the manual opening and closing valve 57 at a location on the opposite side of the valve 57 from the vertical pipe 52.

The flow regulator 56 and the manual opening and closing valve 57 are so located that they overlap each other in plan view (see FIG. 5). And the flow regulator 56 and the manual opening and closing valve 57 which are located in the same area of location along the fore and aft direction D located further to the back than the support main body 31. In the present embodiment, the end or edge portion on the back side of the support main body 31 is located at approximately the same position, along the fore and aft direction D, as the back face 22b of the second divided column member 22 that forms a part of the column 20. In contrast, the flow regulator 56 and the manual opening and closing valve 57 are so located that they overlap with the first divided column member 21 in a side view (see FIG. 6). The flow regulator 56 and the manual opening and closing valve 57 are located further to the back than the back wall portion 72 of the container 7 when the container 7 is placed on the support portion 30. In addition, the flow regulator 56 and the manual opening and closing valve 57 are fixed to the support main body 31 through a second bracket 87 to which they are fixed. The second bracket 87 and the support main body 31 may be formed integrally, or may be separately provided.

The reason for adopting such a layout for the flow regulator 56 is as follows. In the storage rack 2 of the present embodiment, the plurality of columns 20 are distributed over a length along the right and left direction H as described above; and, each support portion 30 is fixed to two mutually adjacent columns 20. Therefore, it is easier to secure the space (for providing other components) further toward the back than the support main body 31, than on the right or left side of the support main body 31 of the support portion 30. Thus, by locating the flow regulator 56 further toward the back than the support main body 31 in the area of location, along the right and left direction H, of the support main body 31, the support portion 30 and the flow regulator 56 can be arranged in a compact area for each storage section S. In addition, since a flow regulator 56 with small overall thickness is used without using a normally closed reserve opening and closing valve, each flow regulator 56 can be so located that it can fit in the same area of location, along the fore and aft direction D, as the first divided column member 21 (see FIG. 6). Therefore, each component required in a purging rack can be arranged in a compact area without having to increase the size of the storage rack 2 along the fore and aft direction D.

As shown in FIG. 1, the transporting members 6 for transporting containers 7 to or from each storage section S of either of the storage racks 2 includes one or more first transport devices 61, one or more moving devices 62, a second transport device 63, and a transfer device 67. Each first transport device 61 is, for example, a hoist-type transport vehicle. Each first transport device 61 travels along guide rails 98 installed in an area near the ceiling 97 of the facility in which the storage facility 1 is installed. Each first transport device 61 carries containers 7, one at a time, onto or out of a moving device 62 by holding the flange 76 provided to the container 7. Each moving device 62 may be a roller conveyor or a belt conveyor, for example. Each moving device 62 moves a container 7 between the inside of the storage room 90 and the outside.

The second transport device 63 is, for example, a stacker crane. The second transport device 63 includes a travel carriage 64 which travels along a travel rail 95 installed on the floor 91 of the storage room 90, a mast 65 disposed vertically on the travel carriage 64, and a vertically movable platform 66 which can be vertically moved while being guided by this mast 65. The transfer device 67 for transferring containers 7 one at a time to or from any one of the storage sections S is provided to the vertically movable platform 66. The transfer device 67 includes a support member 68 generally formed in a plate-shape for supporting a container 7 from below. The support member 68 is configured to be projected and retracted to a projected position at which the support member 68 is projected to be in a storage section S, and to a retracted position at which the support member 68 is retracted toward the vertically movable platform 66. The second transport device 63 having the transfer device 67 performs transfer operations by performing pick up operations and unloading operations to and from any one of the storage sections S and each moving device 62. Here, an unloading operation is an operation in which a container 7 is delivered by the transfer device 67 whereas a pick up operation is an operation in which a container 7 is picked up and received by the transfer device 67.

The first transport device 61, the moving device 62, the second transport device 63, and the transfer device 67 cooperate with one another to perform carrying in operations to carry in (or store) containers 7 into the storage sections S. In addition, they cooperate with one another to perform a carrying out operations to carry out (or retrieve) containers 7 out of the storage sections S. These operations are controlled by one or more controller devices in accordance with set procedures, based on information on detected results from various sensor provided in various parts of the storage facility 1.

Figure 7:
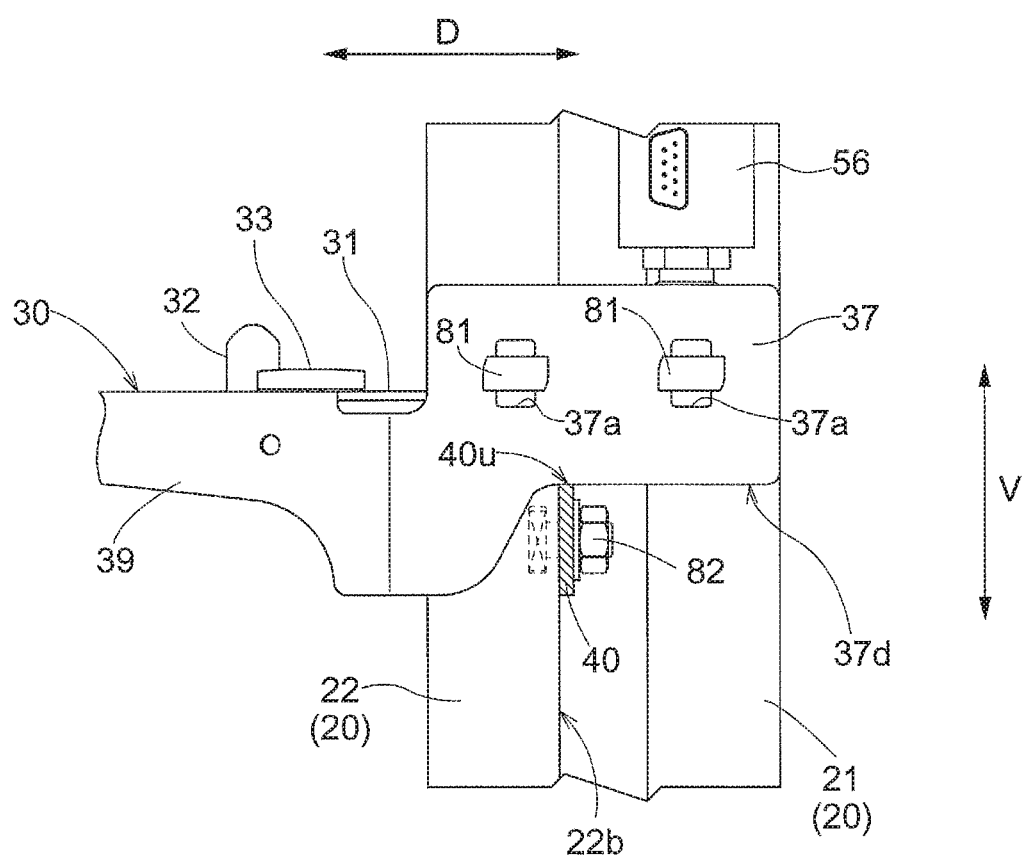
FIG. 7 is a side view of a principal portion of a storage section of an alternative embodiment.

Alternative Embodiments (1) In the embodiment described above, an arrangement is described, as an example, in which each transverse beam member 40 is fixed to the front face 21a of the corresponding first divided column member 21. However, the transverse beam member 40 is not limited to such an arrangement, and may be fixed to the back face 21a of the corresponding second divided column member 22, which is one member of the pair of divided column members 21, 22 that is located on the front side, as shown in FIG. 7. Even with such an arrangement, the transverse beam member 40 can perform the function of each of a positioning member, a rotation restricting member, and a support assist member and thus can provide all the results or effects of the transverse beam member 40 of the embodiment described above.

(2) In the embodiment described above, an arrangement is described, as an example, in which each transverse beam member 40 may be fixed to a half of the entire first divided column members 21 that are mutually adjacent along the right and left direction H. However, the transverse beam member 40 is not limited to such an arrangement. And the number of the first divided column members 21 to which a transverse beam member 40 is fixed may be set to any desired number. In such a case, each transverse beam member 40 may be fixed individually to, for example, two first divided column members 21 that are adjacent each other along the right and left direction H.

(3) In the embodiment described above, an arrangement is described, as an example, in which each support portion 30 is fixed to the corresponding pair of columns 20 with the lower end portion 37d of each attachment plate portion 37 in contact with the upper end portion 40u of a transverse beam member 40. However, the invention is not limited to such an arrangement. And for example, each support portion 30 may be fixed to the columns 20 with an underside of the end portion, on the back side, of the support main body 31 in contact with the upper end portion 40u of a transverse beam member 40.

(4) In the embodiment described above, an arrangement is described, as an example, in which the support main body 31 and the rib portions 39 which partially form the support portion 30 are formed integrally. However, the invention is not limited to such an arrangement. And for example, rib portions 39 formed separately from the support main body 31 may be fixed to the support main body 31.

(5) In the embodiment described above, an arrangement is described, as an example, in which each column 20 is formed by a pair of divided column members 21, 22 spaced apart from each other along the fore and aft direction D. However, each column 20 is not limited to such an arrangement and may be formed by three or more divided column members spaced apart from one another along the fore and aft direction D.

(6) In the embodiment described above, an arrangement is described, as an example, in which each container 7 is generally formed to have a rectangular parallelepiped shape with two corners cut off and in which each vertical pipe 52 is located within a space P which is generally formed in a shape of a pillar and which is formed between the slanted wall portions 74 of mutually adjacent containers 7 that face each other and the corresponding column 20. However, the invention is not limited to an arrangement. And the three dimensional shape of each container 7 can be any desired shape. It is preferable that each vertical pipe 52 is so located that it would not interfere with the containers 7 being stored in the neighboring storage sections S, depending on the three dimensional shape of the containers 7.

Figure 8:
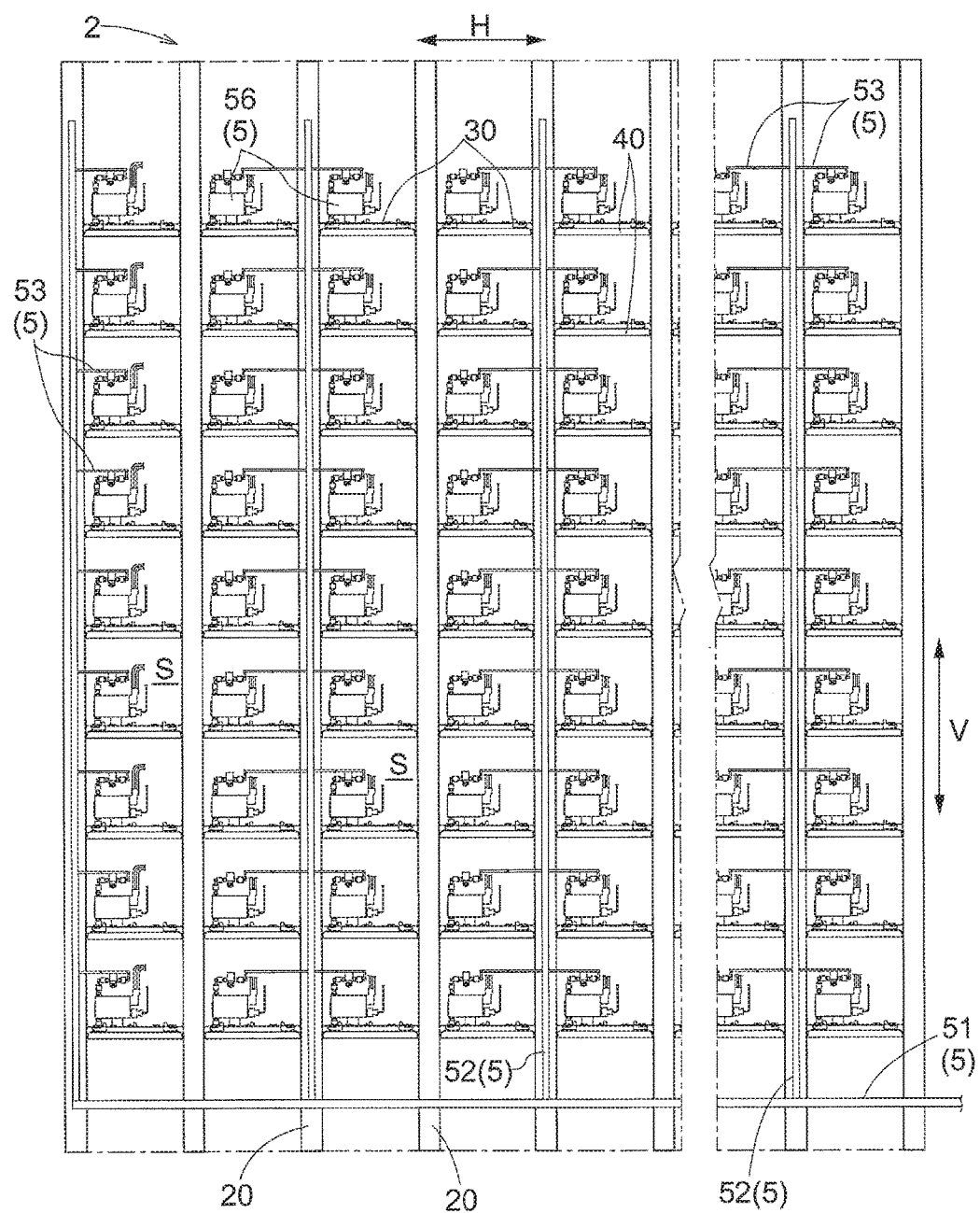
FIG. 8 is a side view of a principal portion of the storage sections of an alternative embodiment.

(7) In the embodiment described above, an arrangement is described, as an example, in which one vertical pipe 52 is individually provided to each column 20 (except for one of the two at right and left ends). However, the invention is not limited to such an arrangement. And it is only necessary for each of the vertical pipes 52 to be fixed to only one of the two columns 20 to which the support portion 30 (to which inert gas is supplied by the vertical pipe 52) is fixed. For example, as shown in FIG. 8, one vertical pipes 52 may be fixed to every other one of the plurality of columns 20 spaced apart from each other along the right and left direction H. In this case, at the most, 2 m branch pipes 53, the number of which is twice the number of levels or horizontal rows of the storage sections S, would be connected to each vertical pipe 52. In this case, the direction in which each branch pipe 53, for a support portion 30 in one vertical row, extends from the corresponding vertical pipe 52 would be opposite from the direction in which each branch pipe 53, for a support portion 30 in the next vertical row, extends from the same vertical pipe 52. Such arrangement has an advantage that, when it is acceptable to have a relatively small number of levels or horizontal rows of the storage sections S, the gas supplying portion 5 can be simplified by reducing the number of the vertical pipes 52.

(8) In the embodiment described above, an arrangement is described, as an example, in which each vertical pipe 52 is fixed to the front face 22a of the corresponding second divided column member 22 and overlaps with the second divided column member 22 in a front view. However, the invention is not limited to such an arrangement. For example, each vertical pipe 52 may be fixed to a side face 21c of the corresponding first divided column member 21 or to a side face 22c of the corresponding second divided column member 22. In this case, the vertical pipe 52 may be located to overlap with the side face 21c of the corresponding first divided column member 21, or with the side face 22c of the corresponding second divided column member 22, in a side view.

(9) In the embodiment described above, an arrangement is described, as an example, in which the flow regulators 56 used are the ones for which, for each flow regulators 56, the amount of gas leak is less than 0.01% when no electric power is supplied to the flow regulators 56. However, the invention is not limited to such an arrangement. And, for each flow regulators 56, the amount of gas leak may be greater than or equal to 0.01% when no electric power is supplied to the flow regulators 56.

(10) In the embodiment described above, an arrangement is described, as an example, in which the flow regulators 56 are used without providing normally closed reserve opening and closing valves. However, the invention is not limited to such an arrangement. And a normally closed reserve opening and closing valve which may be an air valve or a solenoid valve, etc., may be provided in a branch pipe 53 in addition to the flow regulator 56.

(11) In the embodiment described above, an arrangement is described, as an example, in which each flow regulator 56 is located in the area of location of the support main portion 31 of the corresponding support portion 30 along the fore and aft direction D and is located further to the back than the support main body 31. However, the invention is not limited to such an arrangement. For example, when a column 20 and a corresponding support main body 31 are spaced apart from each other in the right and left direction H, the corresponding flow regulator 56 may be located by making use of at least a part of the area between the column 20 and the support main body 31. Alternatively, a flow regulator 56 may be located in an area on the back side of the corresponding support main body 31 such that the flow regulator 56 overlaps with the support main body 31 at least partially in plan view.

(12) In the embodiment described above, an arrangement is described, as an example, in which the vertical pipes 52 are individually fixed to the plurality of columns 20 distributed over a distance along the right and left direction H. However, the invention is not limited to such an arrangement. And for example, the storage sections S may be grouped into units with each unit formed by a plurality of storage sections S forming a number of horizontal rows and a number of vertical rows. And some of the vertical rows may be without support portions 30 so that large-diameter vertical pipes 52 can be installed making use of such vertical rows without the support portions 30.

(13) In the embodiment described above, a storage facility 1 for storing containers 7 for holding one or more semiconductor substrates, as stored objects is described as an example. However, the invention is not limited to such an arrangement. Instead, the objects held in the container 7 and stored may be one or more glass substrates, or one or more reticle substrates formed by glass plates etc. coated with metal thin film. In addition, the objects held in the container 7 and stored are not limited to industrial products (such as raw materials and intermediate products) but may be, for example, food, or medicine, etc. Furthermore, the stored objects stored in the storage facility 1 including the storage racks 2 are not limited to FOUPs. Instead, they may be, for example, cassette type containers 7, and are not limited to containers 7 and may be, for example, pallets with objects placed on them, etc.

Note that an arrangement disclosed in one of the embodiments described above (which include the embodiment described above as well as the alternative embodiments (same is true for all embodiments mentioned below)) may be used in combination with an arrangement disclosed in another of the embodiments unless such combination leads to an inconsistency.

With respect to any other arrangements and structures, the embodiments disclosed in the present description are for illustration purposes only to describe examples. As such, it should be understood that the scope of the invention should not be limited to and by such embodiments. A person skilled in the art will readily understand that modifications may be made as necessary without falling outside the spirit of the present invention. Therefore, any other embodiment with changes and modifications made without departing from the spirit of the present invention would naturally fall within the scope the present invention.

Summary of Embodiments Described Above

A brief summary of the storage rack described above is provided next.

A storage rack comprises:
a plurality of storage sections arranged along a vertical direction and a right and left direction;
a plurality of columns each of which is provided to extend along a vertical direction and each of which includes a pair of divided column members that are spaced apart from each other in a fore and aft direction, with one column provided at each end, along the right and left direction, of the plurality of storage sections and a column provided at a position between two mutually adjacent storage sections;
a transverse beam member which extends along the right and left direction and which is fixed to a front face of a first divided column member which is one of a pair of divided column members that is located toward a back, or to a back face of a second divided column member which is the other of the same pair of divided column members that is located toward a front; and
a support portion for supporting a stored object, the support portion being supported at a back side thereof, in a cantilever manner, by two columns that are adjacent each other along the right and left direction such that at least a portion of the support portion is in contact with an upper end portion of the transverse beam member.

That is, the storage rack including a plurality of storage sections arranged along a vertical direction and a right and left direction comprises:
a plurality of columns each of which is provided to extend along a vertical direction and a support portion supported by the columns for supporting a stored object, with one column provided at each end, along the right and left direction, of the plurality of storage sections and a column provided at a position between two mutually adjacent storage sections;
wherein the support portion is supported by two mutually adjacent columns,
wherein each column includes a pair of divided column members that are spaced apart from each other in a fore and aft direction.

The storage rack further comprises a transverse beam member which extends along the right and left direction and which is fixed to a front face of a first divided column member which is one of a pair of divided column members that is located toward the back, or to a back face of a second divided column member which is the other of the same pair of divided column members that is located toward the front, and wherein the support portion is fixed to the columns in a cantilever manner such that at least a portion of the support portion is in contact with an upper end portion of the transverse beam member.

With such an arrangement, since the transverse beam member whose upper end portion is in contact with the support portion can function as a positioning member, the support portion can be properly positioned in the vertical direction with a high degree of precision even when each such support portion needs to be fixed to two mutually adjacent columns. Therefore, each such support portion can be installed in its proper horizontal attitude (i.e., horizontal in a front view) and the support portions, each so arranged, in each level or horizontal row can be installed at the same height. In addition, such a highly precise positioning of the support portion can be done simply by fixing the support portion to the columns by moving it relative to the upper end portion of the transverse beam member until the support portion contacts the upper end portion; thus, the installation work can be made easier. Therefore, a storage rack can be provided for which installation work is made easier when assembling the storage rack using a plurality of columns and a plurality of support portions and in which the positioning of support portions can be done properly.

In addition, with the arrangement described above, since the transverse beam member for positioning is provided at a location between a pair of the divided column members along the fore and aft directions, a stored object can be inserted deeper into the storage section compared with a case in which the transverse beam member is fixed to the front face of the second divided column member. Therefore, any amount of increase in the dimension, along the fore and aft direction, of the storage rack can be reduced so that the storage efficiency of the storage rack can be improved. In addition, when the support portion is fixed to at least the first divided column member, and when a stored object is placed on the support portion, a part of the load that acts on the support portion can also be received by the transverse beam member. Therefore, the strength of the support portion to support a stored object can be increased. Furthermore, since each column includes a pair of divided column members which are spaced apart from each other along the fore and aft direction, such column has a cost saving advantage while providing the same level of structural strength as a one-piece construction.

In one embodiment, the support portion preferably includes a support main body, and a pair of attachment plate portions which face each other along the right and left direction and each of which is fixed to a corresponding one of the two columns, on a back side of the support main body; and wherein the support portion is preferably fixed to the two columns such that each of the pair of attachment plate portions and the transverse beam member are placed crosswise with each other, and such that a lower end portion of each of the pair of attachment plate portions is in contact with the upper end portion of the transverse beam member.

With such an arrangement, the lower end portion of each of the pair of attachment plate portions can be in contact, in a stable manner, with the upper end portion of the transverse beam member with each of the pair of attachment plate portions and the transverse beam member placed crosswise with each other. Thus, a proper positioning of the support portion along the vertical direction can be accomplished with ease and with high degree of precision. In addition, with such an arrangement, the pair of attachment plate portions would be fixed to respective side faces, of a pair of right and left columns, that face each other. In such a case, when the support portion is fixed to the columns using fastening members including bolts and nuts, the turning of the support portion that otherwise would have accompanied such fixing process can be restricted or prevented by the lower end portion of each attachment plate portion coming into contact with the upper end portion of the transverse beam member. Thus, for this additional reason, each such support portion can be installed in its proper horizontal attitude (i.e., horizontal also in a side view).

In one embodiment, the transverse beam member is preferably fixed to three or more mutually adjacent divided column members that are spaced apart from one another along the right and left direction.

With such an arrangement, since the transverse beam member spans over, and thus is shared by, a plurality of storage sections arranged one next to another along the right and left direction, installation of the transverse beam member is made easier and the function of the transverse beam member as a positioning member can be properly made use of.

In one embodiment, the support portion preferably includes a support main body generally formed in a U-shape in plan view, and a rib portion which extends linearly to connect one of the two columns to a distal end portion of the U-shape which functions as a location where the support main body receives a load, the rib portion being integrally formed with the support main body.

With such an arrangement, a stored object can be easily transferred by making used of a cutout portion of the support main body generally formed in a U-shape in plan view. And since the support portion has a rib portion integrally formed with the support main body, the structural strength of the support portion itself can be increased. In this case, since the rib portion extends linearly to connect one of the two columns to a distal end portion of the U-shape, this arrangement provides a support portion with sufficient strength to support a stored object without having to provide a separate reinforcing member at the connection between the column and the support portion.

In one embodiment, the support main body and the rib portion are preferably integrally formed by bending a metal plate member.

With such an arrangement, a support portion having sufficient support strength despite its lightweight can be formed easily.

What is claimed is:

1. A storage rack comprising:
a plurality of storage sections arranged along a vertical direction and a right and left direction;
a plurality of columns each of which is provided to extend along a vertical direction and each of which includes a pair of divided column members that are spaced apart from each other in a fore and aft direction, with one of the plurality of columns provided at each end, along the right and left direction, of the plurality of storage sections and another of the plurality of columns provided at a position between two mutually adjacent storage sections;
a transverse beam member which extends along the right and left direction and which is fixed to a front face of a first divided column member of the plurality of columns which is one of the pair of divided column members of the plurality of columns that is located toward a back, or to a back face of a second divided column member of the plurality of columns which is the other of the same pair of divided column members of the plurality of columns that is located toward a front; and
at least one support portion for supporting a stored object, the support portion being supported at a back side thereof, in a cantilever manner, by two of the plurality of columns that are adjacent each other along the right and left direction such that at least a portion of the support portion is in contact with an upper end portion of the transverse beam member,
the support portion being fixed to two pairs of the divided column members of said two of the plurality of columns.

2. A storage rack as defined in claim 1, wherein
the support portion includes a support main body, and a pair of attachment plate portions which face each other along the right and left direction and each of which is fixed to a corresponding one of the two of the plurality of columns, on a back side of the support main body; and
wherein the support portion is fixed to the two of the plurality of columns such that each of the pair of attachment plate portions and the transverse beam member are placed crosswise with each other, and such that a lower end portion of each of the pair of attachment plate portions is in contact with the upper end portion of the transverse beam member.

3. A storage rack as defined in claim 1, wherein
the transverse beam member is fixed to three or more mutually adjacent divided column members of the plurality of columns that are spaced apart from one another along the right and left direction.

4. A storage rack as defined in claim 1, wherein
the support portion includes a support main body generally formed in a U-shape in plan view, and a rib portion which extends linearly to connect one of the two columns to a distal end portion of the U-shape which functions as a location where the support main body receives a load, the rib portion being integrally formed with the support main body.

5. A storage rack as defined in claim 4, wherein
the support main body and the rib portion are integrally formed by bending a metal plate member.

6. A storage rack as defined in claim 1, wherein the at least one support portion is one of a plurality of support portions,
wherein each of the plurality of support portions includes a first attachment plate portion and a second attachment plate portion,
wherein the first attachment plate portion is fixed to both of the pair of divided column members forming one of the plurality of columns, and
wherein the second attachment plate portion of each support portion is fixed to both of the pair of divided column members forming another of the plurality of columns which is adjacent along the right and left direction to the column to which the first attachment plate portion is fixed.

7. A storage rack as defined in claim 1, wherein
the transverse beam member is located at a position between the pair of divided column members arranged along the fore and aft direction.

8. A storage rack as defined in claim 1, wherein
all of the plurality of columns include the respective pair of divided column members.

* * * * *